US000001299H

United States Statutory Invention Registration [19]

[11] Reg. Number: H1299

Charles

[43] Published: Apr. 5, 1994

[54] ACID PAINT REMOVER

[75] Inventor: Harry R. Charles, Mt. Clemens, Mich.

[73] Assignee: PPG Industries, Inc., Pittsburgh, Pa.

[21] Appl. No.: 673,994

[22] Filed: Mar. 25, 1991

[51] Int. Cl.[5] ..... G03C 5/00

[52] U.S. Cl. ..... 430/331; 430/309; 430/325; 430/329; 252/143

[58] Field of Search ..... 430/309, 331, 325, 306, 430/329; 134/38, 42, 3; 252/DIG. 8, 142, 143, 145

[56] References Cited

U.S. PATENT DOCUMENTS

| | | | |
|---|---|---|---|
| 3,669,660 | 6/1972 | Golda et al. | 430/331 |
| 3,886,099 | 5/1975 | Hall | 252/548 |
| 4,271,261 | 6/1981 | Shimizu et al. | 430/309 |
| 4,587,030 | 5/1986 | Casey | 252/92 |

FOREIGN PATENT DOCUMENTS

| | | | |
|---|---|---|---|
| 0367074 | 5/1990 | European Pat. Off. | 430/329 |

*Primary Examiner*—Philip Tucker

[57] ABSTRACT

Disclosed is an aqueous acidic developing solution for a photoresist comprising an acid having from about 1 to 8 carbon atoms, in an effective combination with a solubilizing solvent for the photoresist.

13 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ACID PAINT REMOVER

FIELD OF THE INVENTION

The present invention relates to developing solutions. More specifically, the present invention relates to aqueous acidic developing solutions for negative photoresists.

A BRIEF DESCRIPTION OF THE PRIOR ART

Aqueous acidic developing solutions are generally known in the art. The developing compositions are used to selectively remove solubilizable portions of photoresists from the insolubilized portions thereof which had been exposed to patterned irradiation. Unfortunately, many of the prior art aqueous acidic solutions are not selective enough to speedily remove the solubilizable portions without removing the insolubilized portions of the photoresists. In an attempt to make the developing solutions more selective, the art often resorts to diluting the acid developing solutions. However, the dilute solutions tend to be less efficient in removing the solubilizable portions of the photoresist. Thus the efficiency of the solution as a developer becomes diminished.

By the present invention, there is provided an aqueous acid developing solution that speedily develops a negative photoresist without removing the insolubilized portions of the photoresist.

SUMMARY OF THE INVENTION

In accordance with the foregoing, the present invention encompasses an aqueous acidic developing solution for a photoresist comprising an acid having from about 1 to 8, preferably 1 to 3 carbon atoms, in an effective combination with a solubilizing solvent for the photoresist. In a preferred embodiment of the invention, the aqueous acidic solution comprises a mixture of acids containing glycolic acid as a first acid and lactic acid as a second acid, in combination with a photoresist solubilizing solvent comprising ethylene glycol monobutyl ether. An aqueous acidic solution comprising the combination of the mixture of acids and the photoresist solubilizing solvent, at a concentration of about 1% to 5% by weight of the combination of the mixture of acids and the photoresist solubilizing-solvent based on total weight of aqueous developing solution, has been found to be a good developing solution at a temperature of about 80° to 120° F.

Also encompassed by the present invention is a process for developing a negative photoresist comprising contacting the photoresist with the developing solution of the present invention for a period of time sufficient to remove the solubilizable portion of the photoresist while leaving the irradiated photoresist intact.

By the term "photoresist solubilizing solvent" is meant that the structural conformation of the solvent is such that it is capable of contacting and preferably penetrating the photoresist to some degree at the solid liquid interface. This penetration of the photoresist disrupts its molecular parking and changes the density or softens the photoresist. The softened photoresist is now more susceptible to removal by dispersion in an immersion bath of developer solution or by kinetic methods such as spraying developer solution. By the term "effective combination" is meant that when using an acid and solvent developing solution one must establish a balance in respect to the variable efficacies of solvents with the variable efficacies of different acids useful in the invention. For example, if a very effective solvent described as being relatively low in molecular weight and linear in conformation without obstructive side groups is used in concert with a very effective acid described as being relatively low in molecular weight with a high ionization potential, then both the solubilizable and insolubilized portions of the photoresist will be indiscriminately removed. Likewise if large and bulky solvents and acids are used, the rate of attack on the solubilizable photoresist will be too slow to be useful. The key to an "effective combination" is to temper or offset the variable strengths or weaknesses of the solvents with those of the acids. This balance provides a developing solution with a rate of attack that distinguishes the structural and chemical differences between solubilizable and irradiated photoresist.

DETAILED DESCRIPTION OF THE INVENTION

In accordance with the invention, the principal ingredients of the aqueous developing solution are an acid having from about 1 to 8, preferably 1 to 3 carbon atoms, and a photoresist solubilizing solvent, which are present in an aqueous medium. It is believed without being bound that the lower the carbon content of the acid, the faster is its rate of removing the photoresist. Similarly, it is believed that the lower the molecular weight of the photoresist solubilizing solvent, the faster is its rate of removal of the photoresist. The converse of the foregoing is believed to be true. It has, however, been found that in relative terms and with respect to the rate of removal of the photoresist, a combination of a fast-acting acid or an acid with a high efficacy and a slow solubilizing solvent with a low efficacy provides a more efficacious removal of the photoresist. In any event, the rate of removal of the photoresist would depend as well on the temperature of the developing solution and the pressure at which it is applied.

In accordance with this invention, it has been realized that the effect of a developing solution is characterized by the molecular weight of the acid and further characterized by the molecular weight of the solubilizing solvent, and the polarity and/or configuration of the solubilizing solvent. Illustratively, given a useful solubilizing solvent, it is believed that the rate of removal of the acids increases with the decrease in the carbon content of the acid. Conversely, given a useful acid in accordance with the invention, it is believed that the rate of removal of the photoresist increases with the decrease in molecular weight and/or polarity of the solvent. It has been determined in accordance with this invention that the developing solution comprises a specified acid containing from about 1 to 3 carbon atoms which by itself can solubilize the photoresist, in combination with a solubilizing solvent which by itself is almost totally ineffective in solubilizing the photoresist. Illustratively, an acid such as acetic acid which by itself can solubilize the photoresist can be employed in combination with a solubilizing solvent such as propylene glycol which is by itself totally ineffective in solubilizing the photoresist.

In the present embodiment, the invention comprises a water-soluble mixture of at least two acids of low molecular weight in combination with a photoresist solubilizing solvent. The first acid contains from about 1 to 8 carbon atoms and preferably from about 1 to 3 carbon atoms. The first acid is present in an amount of about 15% to 35%, and preferably 23% by 28% by weight based on weight of acids and solubilizing solvent. Illustrative but non-limiting examples of the first acid can be formic acid, acetic acid, hydroxy acetic acid, oxalic acid and lactic acid. The second acid is present in an amount of about 2% to 15%, and preferably 5% to 8% by weight based on weight of acids and solubilizing solvent. The second acid contains from about 1 to 8 carbon atoms and preferably from about 1 to 3 carbon atoms. Illustrative but non-limiting examples of the second acid can be tactic acid, oxalicacetic acid, acetoacetic acid, propionic acid, succinic acid and butyric acid.

The solubilizing solvent useful herein is selected from the group consisting of diethylene glycol monobutyl ether, ethylene glycol monobutyl ether, propylene glycol methyl ether, dipropylene glycol methyl ether, tripropylene glycol methyl ethyl ether, propylene glycol t-butyl ether, ethylene glycol methyl ether, ethylene glycol ethyl ether, triethylene glycol butyl ether, diethylene glycol methyl ether, triethylene glycol methyl ether, ethylene glycol propylether, hexylene glycol, dipropylene glycol methyl ether acetate, propylene glycol methyl ether acetate, ethylene glycol monobutyl ether acetate and ethylene glycol phenyl ether. The solubilizing solvent is present in an amount of about 50% to 83%, and preferably 63% by 70% by weight based on weight of acids and solubilizing solvent.

In the preparation of the aqueous acidic solution of the invention, the ingredients set forth hereinabove can be admixed with water in any order. Optionally, other ingredients such as acid stable surfactants can be formulated into the developing solution. An example of the surfactants that can be used herein include polyglycol resins, acetylenics and fluorosurfactants. The resultant aqueous developing solution typically has an acid concentration of about 0.05% to 20% by weight, preferably 0.25% to 4% by weight, more preferably 0.5% to 1.5% by weight based on total weight of aqueous developing solution. The concentration of solubilizing solvent is 1% to 5%, preferably 1 % to 2.5% by weight based on total weight of aqueous developing solution.

In the practice of this invention, the developing solution is used to contact a photoresist so as to remove the solubilizable portions thereof. The photoresist is contacted with the developing solution by spraying or by immersion means. Typically, the developing solution is employed at a temperature of about 70° F. to 120° F. and preferably 80° F. to 900° F., over a period of about 30 seconds to 120 seconds and preferably 30 seconds to 60 seconds. For a negative photoresist the unexposed portions thereof (during irradiation) are removed from the substrate with the developing solution. Thereafter, the substrate with the insolubilized photoresist can be rinsed with water.

In accordance with the present invention, it has been determined that the presence of the second acid unexpectedly enhances the speed and extent of removing the solubilizable portion of the photoresist, without removing the insolubilized portions thereof.

These and other aspects of the invention are further illustrated by the following non-limiting examples. The first example shows the developing solution and a method of preparing the same. The other examples show the photoresists that can be developed in accordance with the invention and methods of making and developing the same.

EXAMPLE 1

The aqueous developing solution of the invention and a method of preparing the same:

| % w/w | |
|---|---|
| 67.5 | Butyl Cellosolve (a solubilizing solvent) |
| 25.8 | Glycolic Acid (First Acid) |
| 6.7 | Lactic Acid (Second Acid) |

3% by weight of the above concentrate was measured into water to produce an aqueous developing solution of the invention, as follows.

| | % w/w |
|---|---|
| Water | 97.000 |
| Butyl Cellosolve | 2.025 |
| Glycolic Acid | 0.774 |
| Lactic Acid | 0.201 |
| | 100.000 |

EXAMPLE 1A

The following illustrates the preparation of the photoresist and the process of developing the same. The photoresist of this instance was an electrodepositable composition which was prepared as follows.

Isophorone diisocyanate "IPDI" (687.4 grams (g) having 6.21 NCO equivalents) were charged into a 3-liter four-neck round bottom flask which was equipped with a mechanical stirrer, a thermometer, a dropping funnel, and a condenser. A calcium sulfate drying tube was attached to the condenser to protect it from moisture. The flask was heated to 50° C. under stirring. Dibutyltin dilaurate (0.4 g) was added to the IPDI and a mixture of 2-hydroxy-ethyl acrylate (367.8 g, 3.17 OH equivalents) and IONOL®, which is a di-t-butyl-p-cresol (6.3 g), was added to the IPDI at 50° C. to 55° C. through the dropping funnel over the period of 1.5 hours. After the addition was completed, the mixture was stirred at 500° C. for an additional 4 hours to give urethane acrylate (NCO equivalent weight of 350.8) in which free IPDI was estimated to be 0.2 percent (wt/wt) present by HPLC (High Pressure Liquid Chromatography).

EXAMPLE 1B

A mixture of EPON® 1001 (an epoxy resin from Shell Chemical Co. having epoxy equivalent weight "EEW"=534; 1068.0 g) and 4-methyl-2-pentanone (224.3 g) was charged into a 3-liter four-neck round bottom flask which was equipped with a mechanical stirrer, a thermometer, and a Dean-Stark condenser. The flask was heated to reflux in order to remove moisture from the epoxy resin. After the removal of moisture, the flask was cooled to 65° C. and 2-(methylamino)ethanol (1.5 mole; 112.7 g) was added through a dropping funnel over a period of five minutes. An exothermic reaction took place as soon as the addition was completed, and the reaction temperature was maintained at 110° C. until EEW became greater than 24,000. The flask containing the resultant reaction product comprising an epoxy-amine adduct was then cooled to 80° C. and a mixture of the urethane acrylate from Example 1A (338.2 g; 0.99 NCO equivalents) and 4-methyl-2-pentanone (300 g) was added to the amine-epoxy adduct at 80° C. to 85° C. through another dropping funnel over a period of 3 hours. The resulting mixture was stirred at 80° C. for an additional 2 hours to ensure the consumption of the isocyanate groups. EBECRYL® 3600 (an epoxy diacrylate available from Radcure Corporation, 519.9 g) was added to the warm amine-functional resin and the whole mixture was well mixed at 75° C. in the flask. The blended resin mixture (2000 g, 1590.8 g solids) was dispersed by addition to lactic acid (53.7 g, 0.527 equivalents) in deionized water (838.7 g). The aqueous dispersion was further reduced to 35.0 percent (wt/wt) by addition of deionized water (1652 g). 4-methyl-2-pentanone was azeotropically distilled under reduced pressure from the aqueous dispersion, giving an aqueous dispersion of amine-functional resin; solids: 39.1 percent; milliequivalent "MEQ". acid: 0.124; MEQ base: 0.304; particle size: 1440,Å; (number average molecular weight) "Mn": 17,924; (weight average molecular weight) "Mw": 95,125; "Mz": 468,738 (Z average molecular weight).

EXAMPLE 2A

The procedure of Examples 1A and 1B was repeated except that 0.375 moles (25 mole percent) of the 2-(methylamino)ethanol were replaced with dibutyl amine (48.5 g). After dispersion in water and stripping of the volatile solvents, a milky white dispersion resulted with the following characteristics:

(1) Total solids at 110° C.—37.2 percent; (2) Milliequivalent acid per gram —0.147; (3) Milliequivalent base per gram—0.305; (4) Particle size—2290,Å (measured by laser light scattering on Coulter N4 particle size analyzer available from Coulter Company); and (5) Molecular weight Mn=12,130, Mw=75,883, Mz=611,366.

EXAMPLE 2B

An electrophoretic bath was prepared from Example 2A by first reducing the prepared resin to 30 percent solids using deionized water. Mild agitation was used to blend 1425.7 grams of this reduced polymer dispersion with 48.6 grams of trimethylol propane triacrylate. A solution of 19.4 grams of 2-isopropyl thioxanthone and 19.4 grams of 2-hydroxyethyl n-hexanol (hexyl CELLOSOLVE®) was then added to the resin blend under mild agitation. The entire bath was then reduced to 10 percent solids using deionized water. The resulting paint bath had a pH of 4.53 and a conductivity of 750 micromhos/centimeter (cm).

Epoxy-fiberglass circuit boards (available from Nelco, Inc.) measuring 8 cm 12×cm with ½ ounce per square foot of copper on one side were placed in a detergent solution (ASTM D 2248-65) at 165° F. for 5 minutes. The panels were then washed with hot water, followed by a deionized water rinse and oven baked at 82° C. for 5 minutes. The panels were submerged in the prepared electrophoretic bath along with a stainless steel electrode measuring 5 cm×24 cm. Each panel was attached to a direct current (DC) power supply, the panel being the cathode and the stainless steel electrode the anode. The cathode and anode were separated by a distance of approximately 5 cm with the copper side of the board facing the stainless steel anode in the bath. The bath temperature was held at 85° F. and a magnetic stirrer was used to provide mild agitation. An electrical potential of 30 volts was applied for 30 seconds, after which time the panel was removed, rinsed with a water spray, followed by a 0.1 percent by weight SURFYNOL® TG (available from Air Products Corporation)/deionized water rinse. The panel was then flashed in a forced air oven at 82° C. for 60 seconds.

Assuming a coating weight of 30 grams per meter squared per mil film thickness (gm/m$^2$/mil), a film thickness of 5 microns was calculated. The coating was smooth and tack free with no noticeable pinholing or cratering. The coated circuit board was placed in a Kepro® Model BTX-200A UV exposure frame with a polyester film photomask showing lines and spaces in 2 mil increments from 20 mils to 2 mils, and a "Stouffer 21 step density Step Tab" (available from Kepro Circuit Systems, Inc.). The step tablet is a variable-density tablet based on a change in optical density; it has been used to indicate the change in the level of resist polymerization with exposure dose. Exposure time was three minutes. Following exposure, the photo tool was removed easily from the coated circuit board. No apparent residual coating material remained on the photo tool.

The exposed coating was developed by immersing the panel in a developing solution that was prepared in a essentially the same manner as disclosed in Example 1, at 80° F. for 75 seconds. The panel was then rinsed with a water spray and air dried.

Step 8 was held on the Stouffer 21 step - Step Tab Tester (available from Kepro Circuit Systems, Inc.) and a resolution 2 mil lines and spaces was reproduced from the photo tool image. Etching occurred by spraying the sample with ferric chloride solution in a Kepro® Model BTE-202 Bench Top Etcher (available from Kepro Circuit Systems, Inc.) Etchant temperature was 110° F. and exposure time was 140 seconds. A resolution of 2 mil lines and spaces was achieved following etching. Stripping was accomplished by placing the etched panel in a bath of 10 weight percent tactic acid at a temperature of 140° F. for 120 seconds followed by a water spray. Half of the panel was covered with tape and the coated panel was again etched to check the efficiency of stripping. All of the copper was removed from the untaped coated panel surface following 120 seconds in 110° F. ferric chloride.

EXAMPLE 3A

The procedure of Example 2A was repeated except that 490 grams (1.49 equivalents) of the urethane acrylate of Example 1A were used (instead of 0.99 equivalents). A milky white dispersion with the following properties resulted: (1) Total solids at 110° C,: 34.4 percent; (2) Milliequivalent acid/gram: 0.129; (3) Milliequivalent base/gram: 0.265; (4) Particle size: 1250 angstroms (Å) and (5) GPC molecular weight: Mn=12,550; Mw=93,689; Mz=652,833.

EXAMPLE 3B

An electrophoretic bath was prepared by blending 619.7 grams of the dispersion of Example 3A with 21.8 grams of trimethylolpropane triacrylate. A solution of 9.7 grams of 2-isopropyl thioxanthane and 9.7 grams of hexyl cellosolve was added to the blend under mild agitation. The entire bath was reduced to 10 percent solids using deionized water. The resulting bath had a pH of 4.35 and a conductivity of 635 micromhos per centimeter.

Panel preparation, electrocoat bath set up, exposure time, developing, and etching conditions were the same as those for Example 2B. Coat out conditions were 85° F. bath temperature, 50 volts electrical potential for 30 seconds. A film build of 5.7 microns was obtained based on an assumed coating density of 30 gm/m²/mil. The coating was smooth and tack free with no noticeable pinholing or cratering. Following exposure, the photo tool peeled easily from the circuit board. No apparent residual coating material remained on the photo tool. The photoresist was developed with the aqueous acidic solution of this invention as follows:

Following developing, a "step 10" was held on the Stouffer 21 Step Tab and a resolution of 4 mil lines and spaces was reproduced from the photo tool image. Some 2 mil lines were removed during developing. Following etching, a resolution of 4 mils was achieved.

EXAMPLE 4C

Examples of epoxy-fiberglass circuit boards, (available from Nelco, Inc.), measuring 8 cm×12 cm with ½ ounce per square foot of copper on one side were electrophoretically coated with a cationic amine containing UV curable photoresist which was essentially the same as described in the foregoing examples. Prior to coat out, the boards were cleaned in a detergent solution (ASTM D2248-65) at 165° F. for 5 minutes. The panels were then washed with hot water followed by a deionized water rinse, and oven dried at 820° C. for 5 minutes.

These examples were submerged in the prepared electrophoretic bath (10% solids) along with a stainless steel anode. The sample (cathode) was attached to a DC power supply and an electrical potential of 250 volts was applied to the system for 30 seconds. The bath temperature was 95° F. Panels were removed from the bath, rinsed, and oven baked for 1 minute at 120° C. to give a smooth, pinhole-free film of approximately 10.4 mil dry film thickness.

Exposure occurred using a 5 kilowatt vacuum exposure frame from ORC Manufacturing Co., Ltd. A phototool with a line-space resolution of between 1 and 20 mils was placed on the top of each panel in direct contact with the photoresist layer. These were then exposed to a dosage of 150 millijoules per square centimeter (μj/cm²) (at the phototool surface).

50 grams of the developing solution of Example 1 was added to 1,950 grams of deionized water. This bath was held at a constant temperature of 84° F. during developing. An exposed sample was submerged in the developing solution and waved slightly for 45 seconds. The panel was removed from the bath and rinsed with a water spray. Good resolution (non exposed areas clean to copper, no pick off of lines) to 1 mil was obtained.

EXAMPLE 4D 70 grams of the developing solution of Example 1 was added to 1,930 grams of deionized water. This bath was held at a constant temperature of 84° F. during developing. An exposed panel was submerged in the developing solution and waved slightly for 40 seconds. The panel showed slight underdevelopment (small photoresist specs remained in spaces) but otherwise there was good resolution and no pick off of lines down to 1 mil.

EXAMPLE 4E

Epoxy-fiberglass circuit boards were prepared as they were for developing experiments. A cationic, amine containing UV curable photoresist was electrophoretically applied to the samples with an electrical potential of 170 volts for 30 seconds. Bath temperature was 95° F. Following rinsing and a 1 minute at 120° C. dry off, a film build of 0.3 mils was obtained. Panels were exposed using a vacuum exposure frame and phototool identical to that used in the development experiment. A dosage of 199 millijoules per square centimeter (μj/cm²) (at the phototool surface) was used for exposure.

Development occurred in a 2.5% developing solution of Example 1 at 80° F. Development time was 2 minutes, followed by a water spray. No etching occurred between developing and stripping.

EXAMPLE 4F

A stripping solution comprising a 4.0% solution of tactic acid was held at a temperature of 120° F. Panels were immersed in the stripping solution for 3 minutes. Samples were then removed from the stripping solution and following a water spray, it was observed that all of the exposed material had been removed from the circuit traces. Panels were immersed in the stripping solution for 30 minutes. Following a water spray, no exposed resist material remained on the circuit traces.

What is claimed is:

1. An aqueous acidic developing solution for a photoresist comprising an acid or mixture of acids each having from about 1 to 8 carbon atoms, in an effective combination with a solubilizing solvent for the photoresist.

2. The aqueous developing solution of claim 1 wherein the total acid concentration is from about 0.25% to about 4% by weight based on total weight of aqueous developing solution.

3. The aqueous developing solution of claim 2 wherein the total acid concentration is from about 0.5% to about 1.5% by weight based on total weight of aqueous developing solution.

4. The developing solution of claim 1 wherein the acid is selected from the group consistent of formic acid, acetic acid, hydroxy acetic acid, oxalic acid and di-lactic acid.

5. The developing solution of claim 1 which contains hydroxy acetic acid.

6. The aqueous developing solution of claim 1 wherein the solubilizing solvent for the photoresist is selected from the group consisting of diethylene glycol monobutyl ether, ethylene glycol monobutyl ether, propylene glycol methyl ether, dipropylene glycol methyl ether, propylene glycol t-butyl ether and ethylene glycol phenyl ether.

7. The aqueous developing solution of claim 1 wherein the solubilizing solvent is present in an amount of about 1% to about 5% by weight based on total weight of aqueous developing solution.

8. The aqueous developing solution of claim 7 wherein the solubilizing solvent is present in an amount of about 1% to about 2.5% by weight based on total weight of aqueous developing solution.

9. The aqueous acidic developing solution of claim 1 comprising a mixture of at least two acids, each having from about 1 to 3 carbon atoms, in combination with a solvent.

10. The aqueous developing solution of claim 9 wherein the total acid concentration is from about 0.25% to about 4.0% by weight based on total weight of aqueous developing solution.

11. The aqueous developing solution of claim 10 wherein the total acid concentration is from about 0.5 % to about 1.5% by weight based on total weight of aqueous developing solution.

12. The developing solution of claim 10 wherein the mixture of acids is selected from the group consisting of formic acid, acetic acid, hydroxy acetic acid, oxalic acid and lactic acid.

13. The aqueous developing solution of claim 10 wherein the solubilizing solvent for the photoresist is selected from the group consisting of diethylene glycol monobutyl ether, ethylene glycol monobutyl ether, propylene glycol methyl ether, dipropylene glycol methyl ether, propylene glycol t-butyl ether and ethylene glycol phenyl ether.

* * * * *